US012593470B2

(12) United States Patent
Verma et al.

(10) Patent No.: US 12,593,470 B2
(45) Date of Patent: Mar. 31, 2026

(54) DEPOSITION OF GATE LINES AND GATE LINE EXTENSIONS ON A SEMICONDUCTOR SUBSTRATE

(71) Applicant: UNITED MICROELECTRONICS CORP., Hsin-Chu City (TW)

(72) Inventors: Purakh Raj Verma, Singapore (SG); Su Xing, Singapore (SG); Jinyu Liao, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 581 days.

(21) Appl. No.: 17/950,066

(22) Filed: Sep. 21, 2022

(65) Prior Publication Data

US 2024/0063282 A1      Feb. 22, 2024

(30) Foreign Application Priority Data

Aug. 18, 2022    (TW) .................................. 111131181

(51) Int. Cl.
| | |
|---|---|
| *H10D 30/67* | (2025.01) |
| *H03F 3/16* | (2006.01) |
| *H10D 87/00* | (2025.01) |

(52) U.S. Cl.
CPC ....... *H10D 30/673* (2025.01); *H10D 30/6713* (2025.01); *H10D 87/00* (2025.01); *H03F 3/16* (2013.01); *H03F 2200/294* (2013.01)

(58) Field of Classification Search
CPC .. H10D 30/673; H10D 20/6713; H10D 87/00;

H10D 64/517; H10D 89/10; H10L 23/50; H10L 23/482; H10L 23/498; H01L 23/483; H02F 3/16; H03F 2200/294

See application file for complete search history.

(56) References Cited

U.S. PATENT DOCUMENTS

| | | | | |
|---|---|---|---|---|
| 6,387,739 B1 | | 5/2002 | Smith, III | |
| 6,555,446 B1 | * | 4/2003 | Unnikrishnan | ...... H10D 30/673 |
| | | | | 438/459 |
| 9,847,349 B1 | * | 12/2017 | Monroy Aguirre | .. H10D 62/364 |
| 2005/0012161 A1 | * | 1/2005 | Sato | ...................... H10D 89/10 |
| | | | | 257/E27.099 |
| 2005/0173645 A1 | * | 8/2005 | Endo | ...................... H04N 25/30 |
| | | | | 250/370.11 |
| 2008/0296700 A1 | * | 12/2008 | Kang | .................... H10D 84/83 |
| | | | | 438/587 |
| 2009/0085118 A1 | | 4/2009 | Hong | |

(Continued)

FOREIGN PATENT DOCUMENTS

TW          200527909          8/2005

*Primary Examiner* — Galina G Yushina
(74) *Attorney, Agent, or Firm* — Winston Hsu

(57) ABSTRACT

A semiconductor device includes a substrate having an active area, a first gate line extending along a first direction on the active area, a first gate line extension adjacent to the first gate line and outside the active area, a second gate line extending along the first direction on the active area and adjacent to the first gate line, and a second gate line extension adjacent to the second gate line and outside the active area. Preferably, the active area includes a first indentation and a second indentation, in which the first gate line extension overlaps the first indentation and the second gate line extension overlaps the second indentation.

15 Claims, 8 Drawing Sheets

(56) References Cited

U.S. PATENT DOCUMENTS

| | | | | |
|---|---|---|---|---|
| 2015/0228343 A1* | 8/2015 | Park | .................... | H10B 43/35 |
| | | | | 365/185.18 |
| 2016/0079354 A1* | 3/2016 | Park | ................. | H10D 30/6217 |
| | | | | 257/386 |
| 2017/0288059 A1* | 10/2017 | Athanasiou | ......... | H10D 64/519 |
| 2022/0084959 A1* | 3/2022 | Kim | .................... | H01L 23/528 |
| 2022/0157960 A1* | 5/2022 | Cho | .................. | G11C 11/4085 |

* cited by examiner

DEPOSITION OF GATE LINES AND GATE LINE EXTENSIONS ON A SEMICONDUCTOR SUBSTRATE

BACKGROUND OF THE INVENTION

1. Field of the Invention

The invention relates to a semiconductor device, and more particularly, to a transistor structure applied in low noise amplifier (LNA) devices.

2. Description of the Prior Art

As technology evolves, wireless communication is an important part of human life. Various electronic devices, such as smart phones, smart wearable devices, tablets, etc., utilize wireless radio frequency (RF) systems to transmit and receive wireless signals. A low noise amplifier (LNA) and a power amplifier (PA) are necessary amplifying circuits in the wireless RF system. In order to achieve better performance (e.g., linearity), the amplifying circuit requires an appropriate bias point. A common way is to electrically connect a biasing module to the amplifying circuit, so as to utilize the biasing module for providing a bias point for the amplifying circuit.

Nevertheless in conventional art, part of the design parameters of transistors in LNA devices including high gate resistance, gate to body capacitance, minimum noise figures are still unsatisfactory. Since these parameters play a critical role in performance of the LNA devices, how to effectively improve these parameters has become an important task in this field.

SUMMARY OF THE INVENTION

According to an embodiment of the present invention, a semiconductor device includes a substrate comprising an active area, a first gate line extending along a first direction on the active area, and a first gate line extension adjacent to the first gate line and outside the active area.

According to another aspect of the present invention, a semiconductor device includes a substrate having an active area, a first gate line extending along a first direction on the active area, a first gate line extension adjacent to the first gate line and outside the active area, a second gate line extending along the first direction on the active area and adjacent to the first gate line, and a second gate line extension adjacent to the second gate line and outside the active area. Preferably, the active area includes a first indentation and a second indentation, in which the first gate line extension overlaps the first indentation and the second gate line extension overlaps the first indentation.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
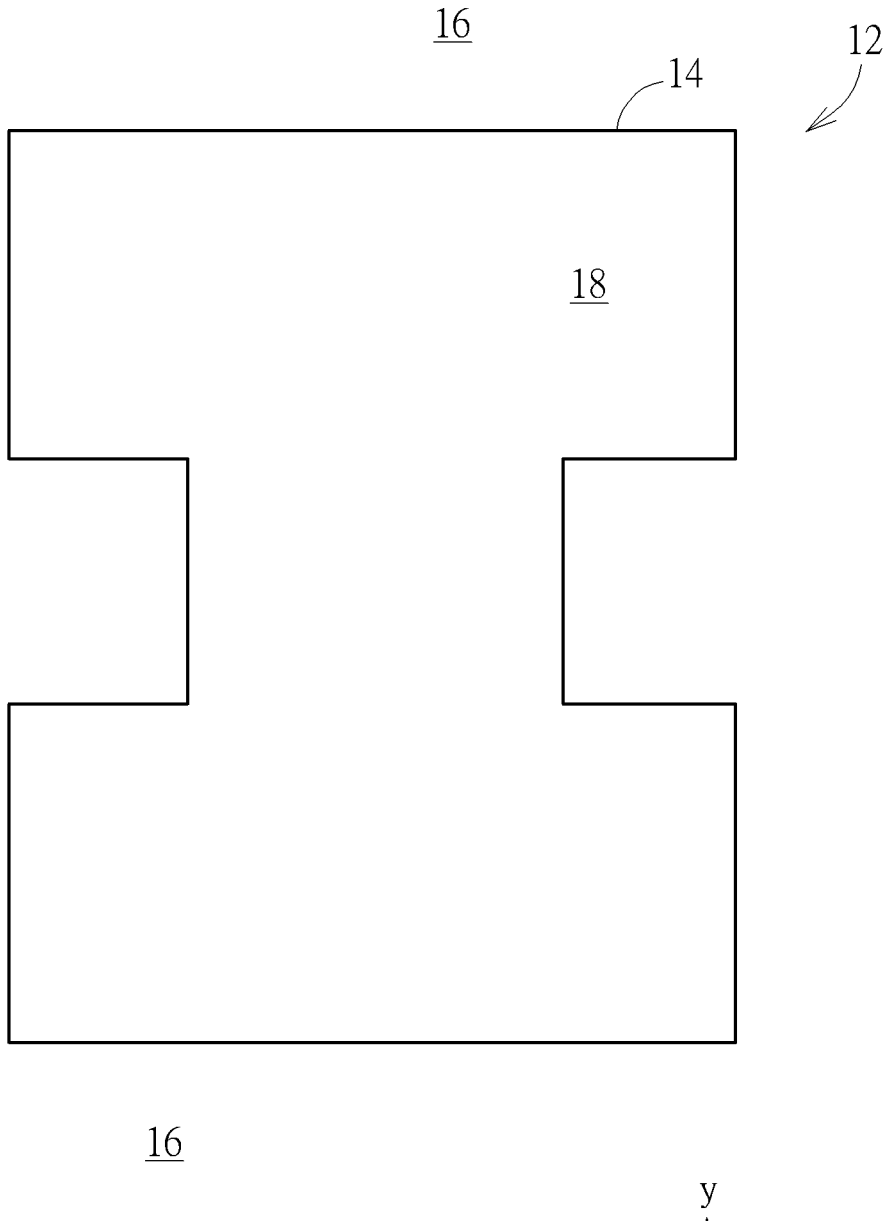
FIGS. 1-7 illustrate a method for fabricating a semiconductor device applied for LNA device according to an embodiment of the present invention.

Referring to FIGS. 1-7, FIGS. 1-7 illustrate a method for fabricating a semiconductor device applied for LNA device according to an embodiment of the present invention. As shown in FIG. 1, a substrate 12 made of semiconductor material is provided, in which the substrate 12 could be selected from the group consisting of silicon (Si), germanium (Ge), Si—Ge compounds, silicon carbide (SiC), and gallium arsenide (GaAs). Next, an active region 14 is defined on the substrate 12, a shallow trench isolation (STI) 16 made of insulating material such as silicon oxide in the substrate 12 of the active region 14, and then an ion implantation process is conducted to form a well region such as a p-well 18 in the substrate 12. It should be noted that even though the ion implantation process is conducted to implant ions into both the STI 16 and the substrate 12, the well region is only formed in the substrate 12 of the active region 14.

Figure 2:
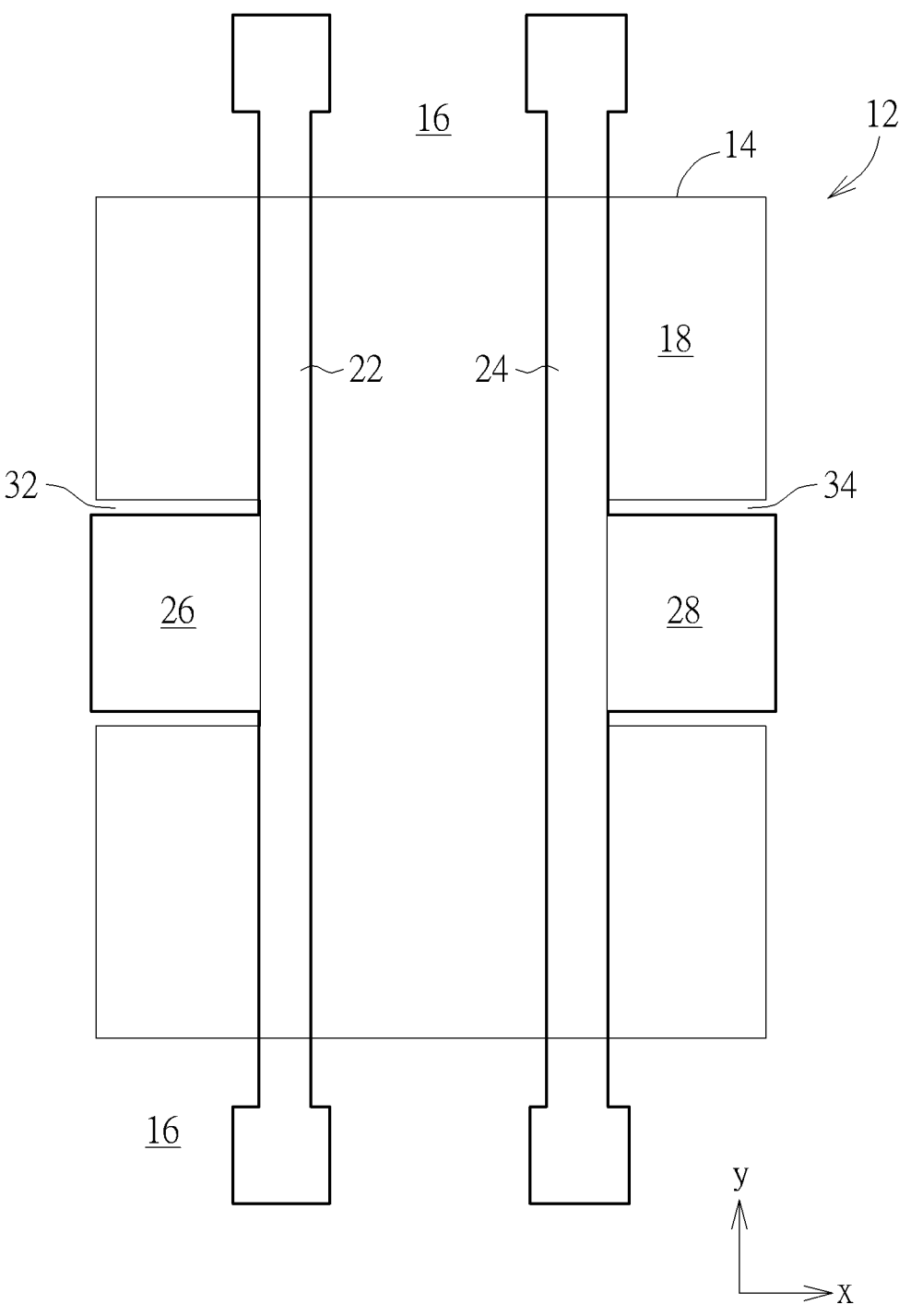

Next, as shown in FIG. 2, gate patterns including gate lines 22, 24, gate line extension 26, and gate line extension 28 are formed on the substrate 12, in which the two gate lines 22, 24 are extending along a first direction such as Y-direction on the active region 14, the gate line extension 26 on the left is extended and protruding outward from the left gate line 22 and disposed immediately adjacent to the gate line 22, the gate line extension 28 on the right is extended and protruding outward from the right gat line 24 and disposed immediately adjacent to the gate line 24. Viewing from a more detailed perspective, the active region 14 includes two indentations 32, 34 retracted inward including an indentation 32 on the left side of the left gate line 22 and another indentation 34 on the right side of the right gate line 24. The two indentations 32, 34 facilitate the active region 14 to include an H-shape or more specifically an H-shape rotated 90 degrees in a top view perspective, in which the gate line extension 26 on the left is situated outside the active region 14 and overlapping the left indentation 32 while the gate line extension 28 on the right is also situated outside the active region 14 and overlapping the right indentation 34. It should be noted that the edges of the gate line extensions 26, 28 could be aligned with or not aligned with the edges of the active region 14. For instance, the left edge of the left gate line extension 26 could be aligned with or not aligned with the edge of the active region 14 above and below the gate line extension 26 along Y-direction and the right gate line extension 28 could be aligned with or not aligned with the edge of the active region 14 above and below the gate line extension 28 along Y-direction, which are all within the scope of the present invention.

Preferably, the gate line patterns including the gate lines 22, 24 and gate line extensions 26, 28 could all be fabricated through a gate first process, a high-k first process from a gate last process, or a high-k last process from the gate last process to form a monolithic structure altogether. In other words, the gate lines 22, 24 and gate line extensions 26, 28 could be polysilicon gate lines and polysilicon gate line extensions made from polysilicon or could be metal gate lines and metal gate line extensions transformed from poly-silicon gate lines and extensions through replacement metal gate (RMG) process into metal gate lines and extensions, which are all within the scope of the present invention. Since the fabrication of polysilicon gate patterns and metal gate patterns are well known to those skilled in the art, the details of which are not explained herein for the sake of brevity.

Figure 3:
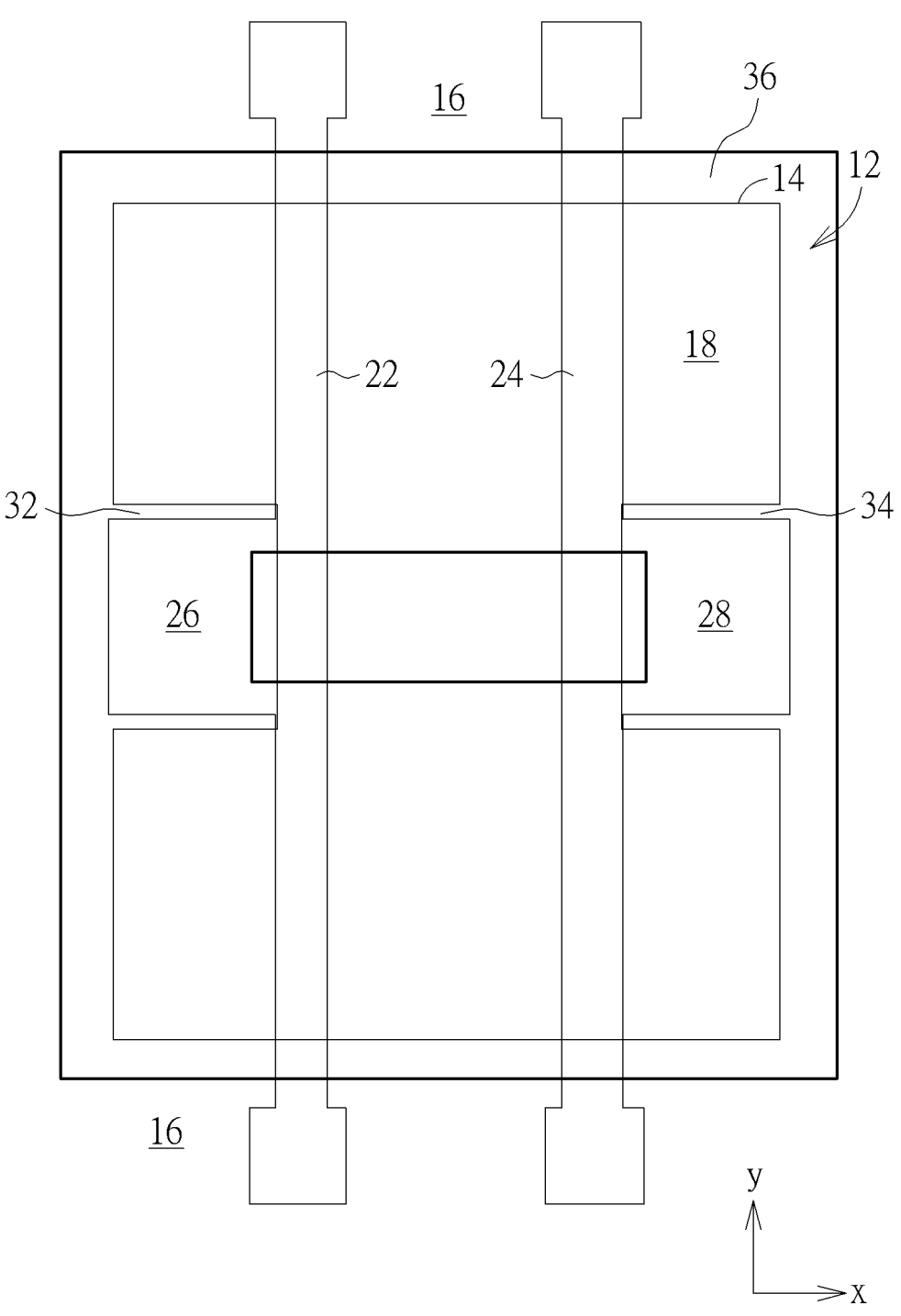

Next, as shown in FIG. 3, a patterned mask (not shown) could be formed on the substrate 12 to expose major part of the active region 14, an ion implantation process is con-ducted to implant dopants such as n-type dopants into the substrate 12 on the active region 14 for forming a doped region such as a n+ region 36, and the patterned mask is removed thereafter. Preferably, the n+ region 36 covers major part of the active region 14 adjacent to two sides of the gate lines 22, 24 but exposes the active region 14 between the two gate lines 22, 24 and the two indentations 32, 34.

Figure 4:
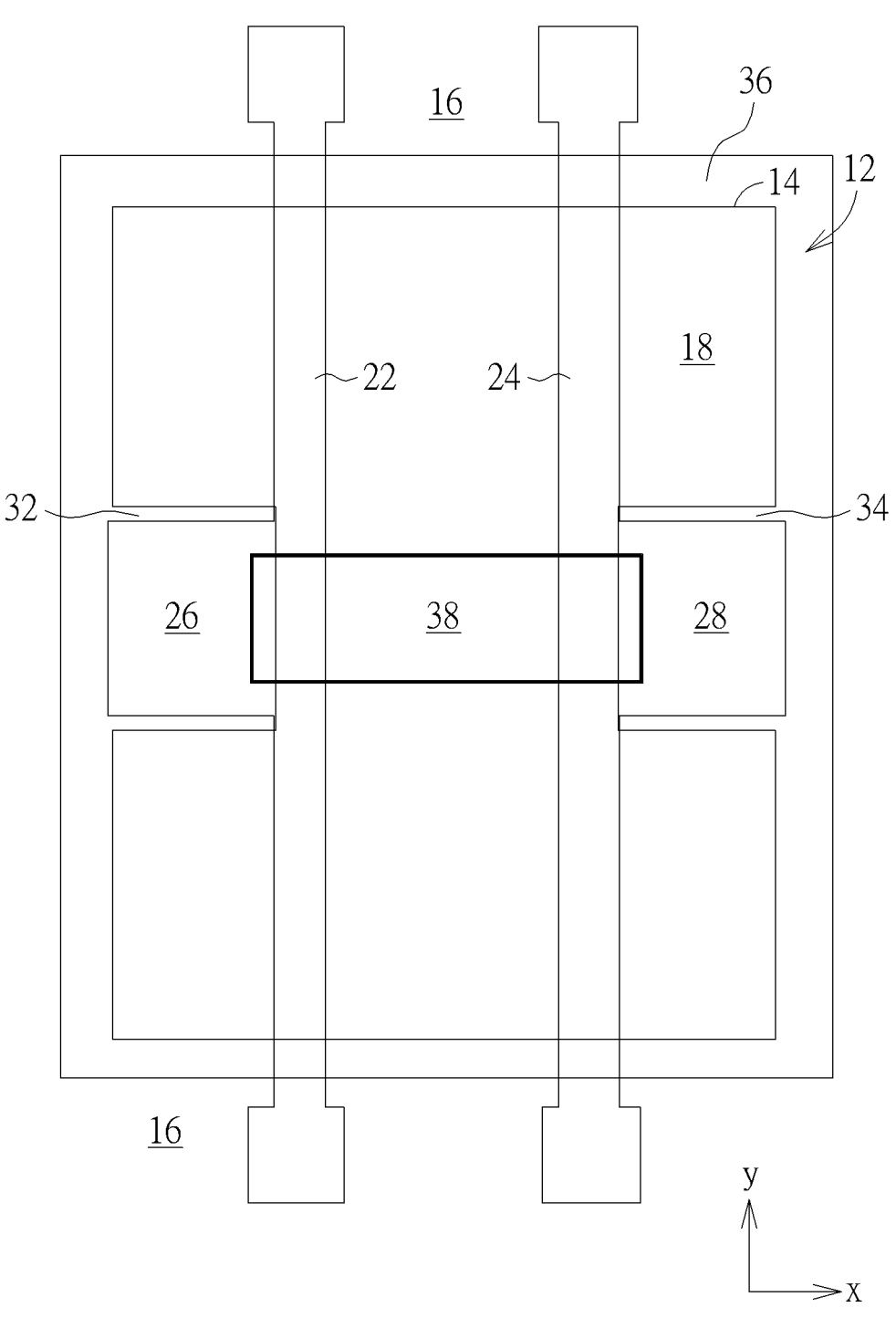

Next, as shown in FIG. 4, another patterned mask (not shown) is formed on the substrate 12 to expose part of the active region 14 between the gate lines 22, 24, and then another ion implantation process is conducted to implant opposite dopants such as p-type dopants into the substrate 12 between the two indentations 32, 34 for forming a p+ region 38.

Figure 5:
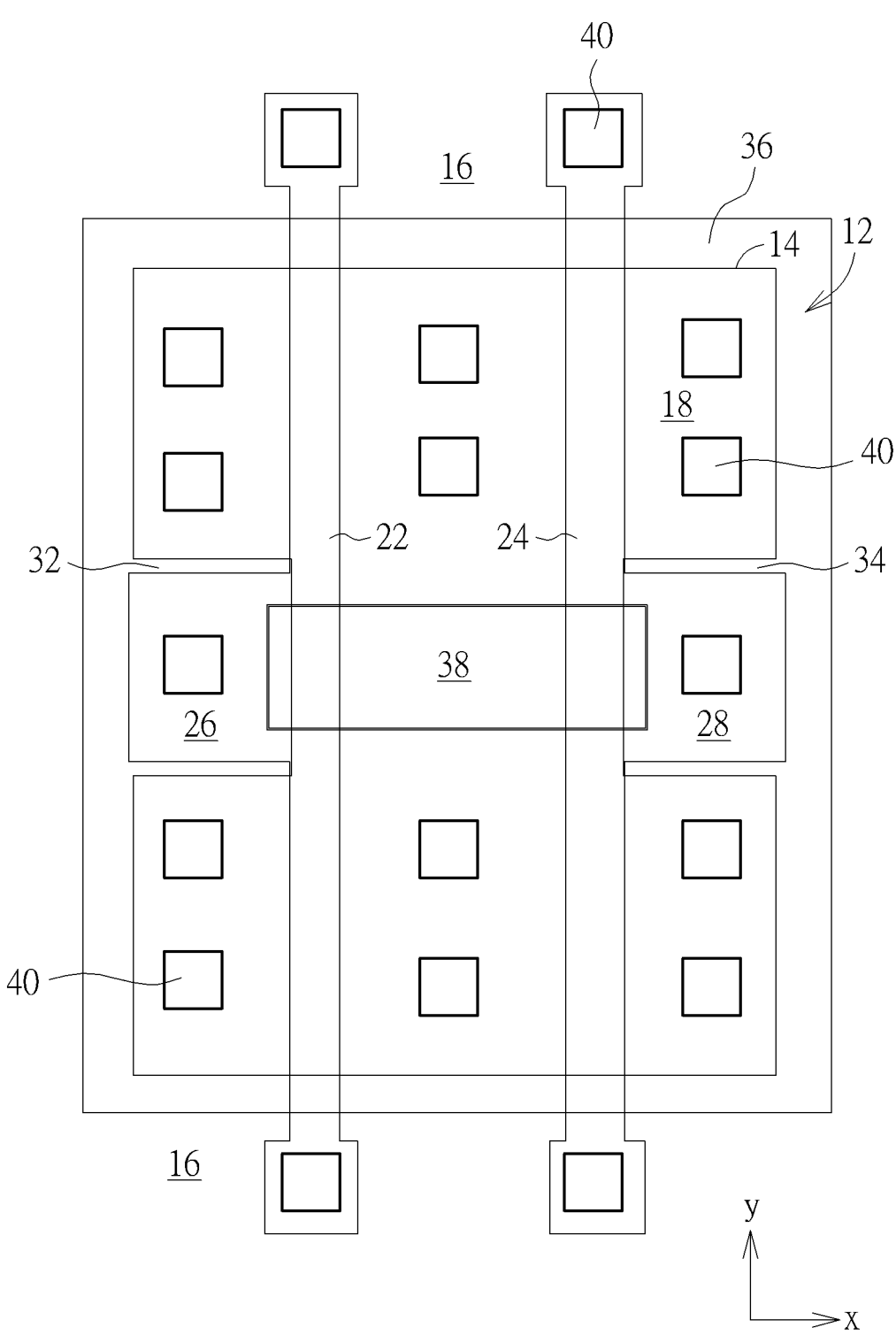

Next, as shown in FIG. 5, a contact plug formation process is conducted to form a plurality of contact plugs 40 on the gate lines 22, 24, the gate line extensions 26, 28, and the n+ region 36. The formation of the contact plugs 40 could be accomplished by first forming an interlayer dielec-tric (ILD) layer (not shown) on the substrate 12, and then conducting a pattern transfer process by using a patterned mask to remove part of the ILD layer adjacent to each of the gate lines 22, 24 for forming a plurality of contact holes exposing the gate lines 22, 24 and the n+ region 36. Next, conductive materials including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as chemical mechani-cal polishing (CMP) process is conducted to remove part of aforementioned barrier layer and low resistance metal layer for forming contact plugs 40 electrically connecting the gate lines 22, 24, the gate line extensions 26, 28, and the n+ region 36.

Figure 6:
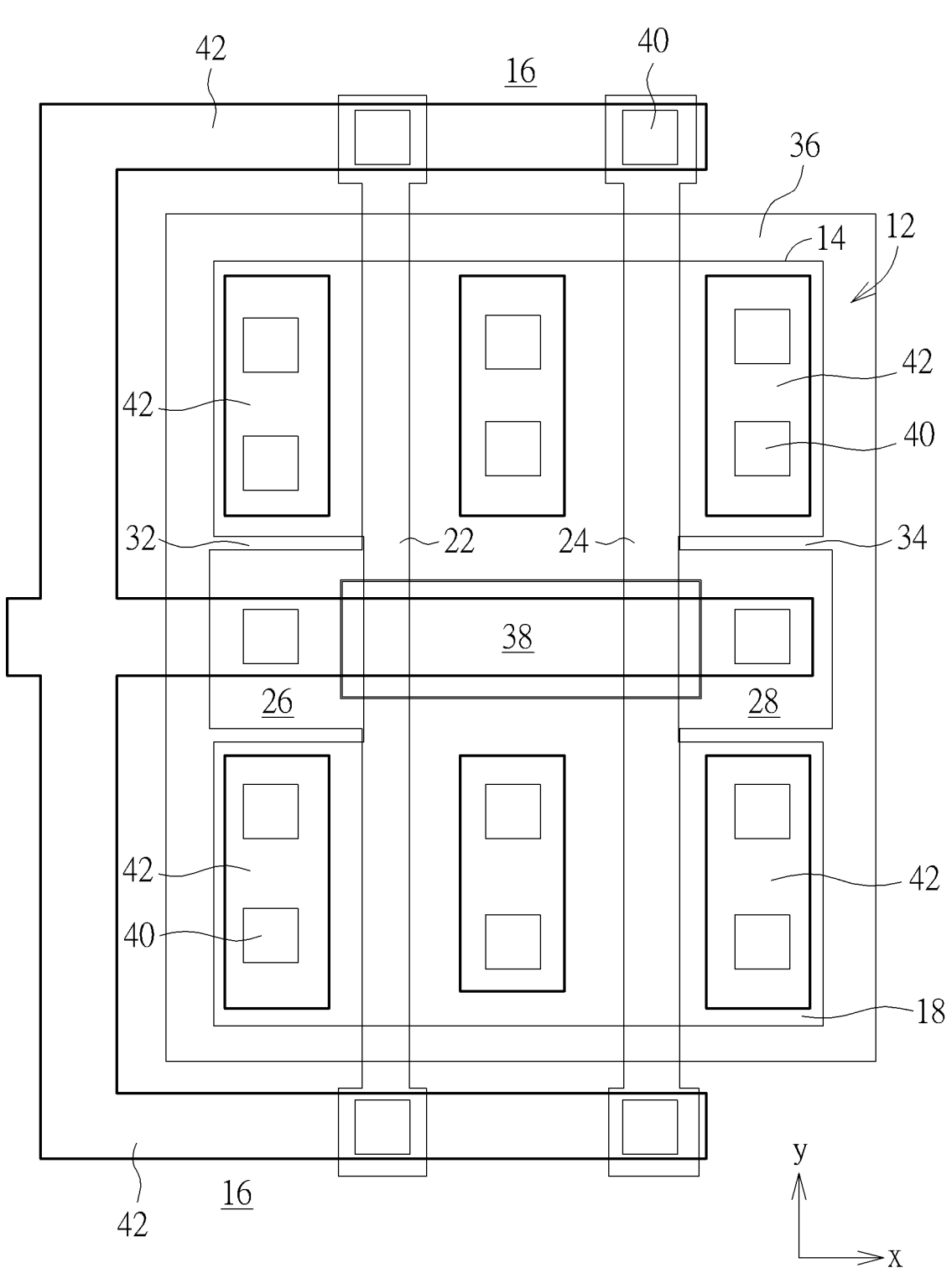

Next, as shown in FIG. 6, a metal interconnective process could be connected to form an inter-metal dielectric (IMD) layer on the ILD layer and first level metal interconnections 42 (also referred to as M1) in the IMD layer to electrically connect the contact plugs 40. Preferably, part of the first level metal interconnections 42 could be formed to connect the contact plugs 40 by connecting two contact plugs 40 at the same time as a group while the other first level metal interconnections 42 could be formed to connect the contact plugs 40 on two ends of the two gate lines 22, 24 and contact plugs 40 directly above the gate line extensions 26, 28. In this embodiment, the first level metal interconnections 42 after connecting the contact plugs 40 are extending outside the active region 14 on the STI 16 adjacent to left side of the gate line 26.

Figure 7:
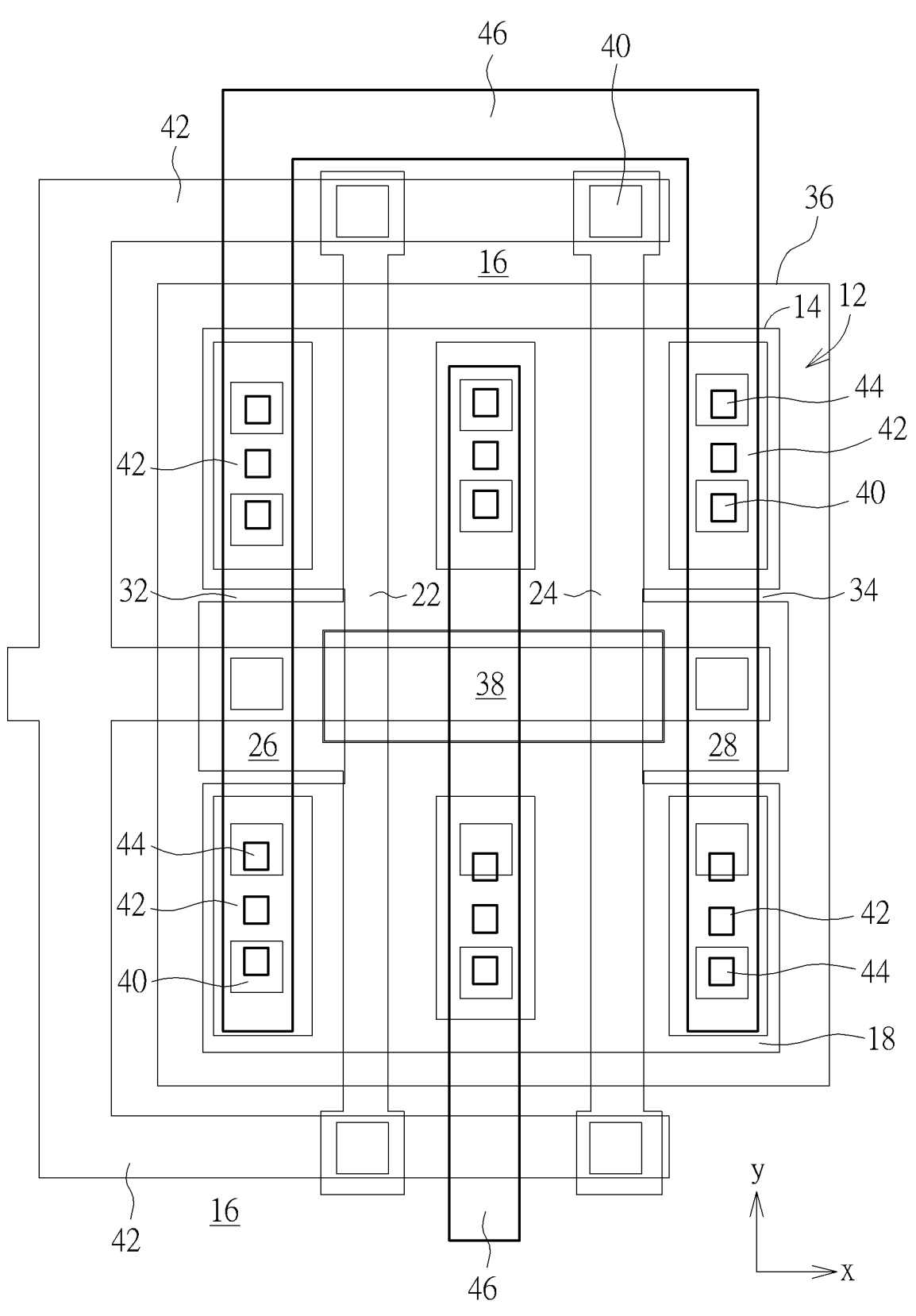

Next, as shown in FIG. 7, another metal interconnective process is conducted to form via conductors 44 and second level metal interconnections (also referred to as M2) extend-ing along the Y-direction for connecting the first level metal interconnection 42 between the gate lines 22, 24 and first level metal interconnection 42 adjacent to two sides of the gate lines 22, 24. This completes the fabrication of a semiconductor device according to an embodiment of the present invention.

Figure 8:
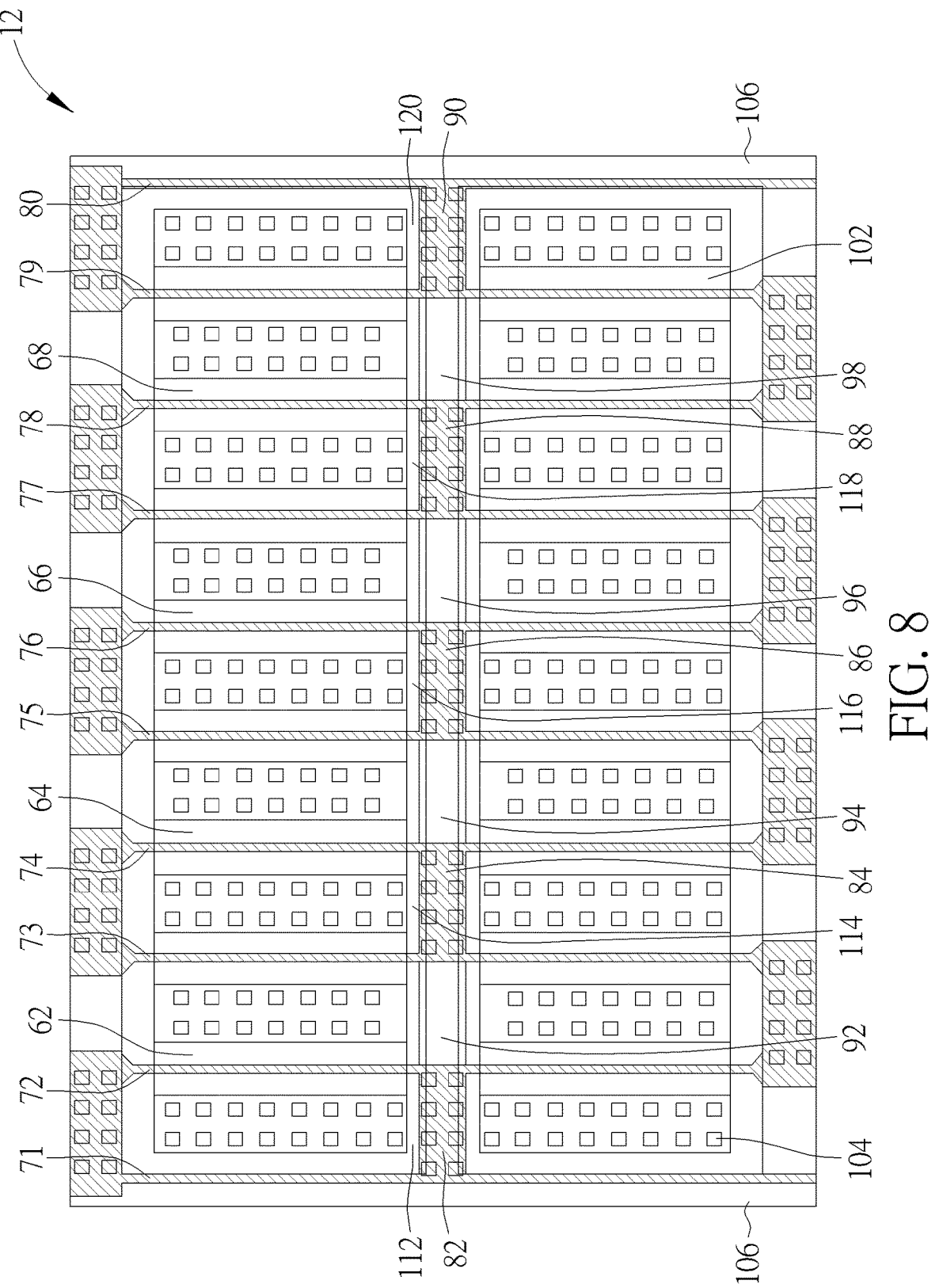
FIG. 8 illustrates a top view layout diagram of a semiconductor device according to an embodiment of the present invention.

Referring to FIG. 8, FIG. 8 illustrates a top view layout diagram of a semiconductor device according to an embodi-ment of the present invention. As shown in FIG. 8, in contrast to the aforementioned embodiment of only defining a single active region on the substrate 12, the semiconductor device of this embodiment includes a plurality of active regions 62, 64, 66, 68 on the substrate 12, a plurality of gate lines (marked by slanted lines) 71, 72, 73, 74, 75, 76, 77, 78, 79, 80 extending along a first direction such as Y-direction on the active regions 62, 64, 66, 68, gate line extensions (also marked by slanted lines) 82, 84, 86, 88, 90 disposed adjacent to two sides of the gate lines 71, 72, 73, 74, 75, 76, 77, 78, 79, 80, p+ regions 92, 94, 96, 98 extending along a second direction such as X-direction between the gate lines 72, 73, 74, 75, 76, 77, 78, 79 and at relative center of each of the active regions 62, 64, 66, 68, a n+ region 102 surrounding the p+ regions 92, 94, 96, 98, contact plugs 104 disposed on the active regions 62, 64, 66, 68 adjacent to two sides of the gate lines 71, 72, 73, 74, 75, 76, 77, 78, 79, 80, and a first level metal interconnection 106 connecting the gate lines 71, 72, 73, 74, 75, 76, 77, 78, 79, 80. To simplify the presentation of the overall structure, via conductors and a second level metal interconnection on top of the first level metal interconnection 106 is omitted in this embodiment.

It should be noted that since each of the active regions 62, 64, 66, 68 includes a H-shape or H-shape rotated 90 degrees in a top view perspective similar to the aforementioned embodiment as the active regions 62, 64, 66, 68 are disposed immediately adjacent to each other, part of the n+ region 102 in each of the active regions 62, 64, 66, 68 preferably overlap the n+ region 102 in the adjacent active regions 62, 64, 66, 68 while the p+ regions 92, 94, 96, 98 disposed in the center regions of the active regions 62, 64, 66, 68 do not overlap adjacent active regions 62, 64, 66, 68.

Viewing from a more detailed perspective, a plurality of gate lines such as ten gate lines 71, 72, 73, 74, 75, 76, 77, 78, 79, 80 disclosed in this embodiment are extending along Y-direction on the substrate 12, a gate line extensions 82 is disposed adjacent to one side such as left side of the gate line 72, a gate line extension 84 is disposed adjacent to between the gate lines 73, 74, a gate line extension 86 is disposed between the gate lines 75, 76, a gate line extension 88 is disposed between the gate lines 77, 78, a gate line extension 90 is disposed adjacent to one side such as right side of the gate line 79, an indentation 112 is disposed adjacent to one side such as left side of the gate line 72, an indentation 114 is disposed between the gate lines 73, 74, an indentation 116 is disposed between the gate lines 75, 76, an indentation 118 is disposed between the gate lines 77, 78, an indentation 120 is disposed adjacent to one side such as right side of the gate line 79, a p+ region 92 is disposed between the gate lines 72, 73, a p+ region 94 is disposed between the gate lines 74, 75, a p+ region 96 is disposed between the gate lines 76, 77, a p+ region 98 is disposed between the gate lines 78, 79, and a n+ region 102 is disposed on the active regions 62, 64, 66, 68 adjacent to two sides of the gate lines 71, 72, 73, 74, 75, 76, 77, 78, 79, 80. Preferably, the gate line extension 82 overlaps the indentation 112, the gate line extension 84 overlaps the indentation 114, the gate line extension 86 overlaps the indentation 116, the gate line extension 88 overlaps the indentation 118, and the gate line extension 90 overlaps the indentation 120.

Typically, current LNA devices have shortcomings such as high minimum noise figure and gate to body capacitance. To resolve this issue, the present invention discloses an improved transistor element applied in LNA devices that principally form gate line extensions extended or protruded outward from the gate line and disposed on the STI outside the active region while overlapping the indentations formed adjacent to two sides of the active region. By using the design, it would be desirable to obtain a much better maximum oscillation frequency (fmax) and current gain under low current environment thereby improving performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising an active area, wherein the active area comprises a first indentation and a second indentation;
a first gate line extending along a first direction on the active area;
a first gate line extension adjacent to a long side of the first gate line and outside the active area and overlapping the first indentation;
a second gate line extending along the first direction on the active area and adjacent to the first gate line; and
a second gate line extension adjacent to the second gate line and outside the active area, wherein the second gate line extension overlaps the second indentation.

2. The semiconductor device of claim 1, further comprising:
a first doped region extending along a second direction in the substrate between the first gate line and the second gate line; and
a second doped region around the first doped region and overlapping the active area.

3. The semiconductor device of claim 2, wherein the first doped region and the second doped region comprise different conductive type.

4. A semiconductor device, comprising:
a substrate comprising a first active area and a second active area;
a first gate line and a second gate line extending along a first direction on the first active area;
a third gate line and a fourth gate line extending along the first direction on the second active area, wherein the second gate line and the third gate line are parallel and the second gate line is between the first gate line and the third gate line; and
a first gate line extension extending along a second direction between the second gate line and the third gate line and not between the first gate line and the second gate line.

5. The semiconductor device of claim 4, wherein the first gate line extension connects the second gate line and the third gate line.

6. The semiconductor device of claim 4, further comprising:
a fifth gate line extending along the first direction adjacent to the first gate line;
a sixth gate line extending along the first direction adjacent to the fourth gate line;
a second gate line extension between the fifth gate line and the first gate line; and
a third gate line extension between the fourth gate line and the sixth gate line.

7. The semiconductor device of claim 6, wherein the second gate line extension connects the fifth gate line and the first gate line.

8. The semiconductor device of claim 6, wherein the third gate line extension connects the fourth gate line and the sixth gate line.

9. The semiconductor device of claim 6, further comprising:
a first indentation between the second gate line and the third gate line;
a second indentation between the fifth gate line and the first gate line; and
a third indentation between the fourth gate line and the sixth gate line.

10. The semiconductor device of claim 9, wherein the first gate line extension overlaps the first indentation.

11. The semiconductor device of claim 9, wherein the second gate line extension overlaps the second indentation.

12. The semiconductor device of claim 9, wherein the third gate line extension overlaps the third indentation.

13. The semiconductor device of claim 4, further comprising:
a first doped region extending along the second direction in the substrate between the first gate line and the second gate line; and
a second doped region extending along the second direction between the third gate line and the fourth gate line.

14. The semiconductor device of claim 13, wherein the first doped region and the second doped region comprise same conductive type.

15. The semiconductor device of claim 4, wherein the first gate line extension is directly connected to a first long side of the second gate line and a second long side of the third gate line and the first long side and the second long side are not the same side.

* * * * *